US008514579B2

(12) United States Patent
Stolze et al.

(10) Patent No.: US 8,514,579 B2
(45) Date of Patent: Aug. 20, 2013

(54) POWER SEMICONDUCTOR MODULE INCLUDING SUBSTRATES SPACED FROM EACH OTHER

(75) Inventors: Thilo Stolze, Arnsberg (DE); Olaf Hohlfeld, Warstein (DE); Peter Kanschat, Soest (DE)

(73) Assignee: Infineon Technologies AG, Neubiberg (DE)

( * ) Notice: Subject to any disclaimer, the term of this patent is extended or adjusted under 35 U.S.C. 154(b) by 481 days.

(21) Appl. No.: 12/776,639

(22) Filed: May 10, 2010

(65) Prior Publication Data
US 2010/0284155 A1 Nov. 11, 2010

(30) Foreign Application Priority Data
May 11, 2009 (DE) .................... 10 2009 002 993

(51) Int. Cl.
*H05K 7/00* (2006.01)

(52) U.S. Cl.
USPC ........... 361/728; 361/700; 361/707; 361/708; 361/717; 361/721; 361/737; 361/803; 257/678; 257/684; 257/691; 257/700; 257/704; 257/718; 257/719; 257/724; 439/73

(58) Field of Classification Search
USPC ................. 361/728, 700, 707, 708, 717, 721, 361/737, 803; 257/678, 684, 691, 692, 700, 257/704, 718, 719, 724; 439/73
See application file for complete search history.

(56) References Cited

U.S. PATENT DOCUMENTS

| 5,444,295 | A  | * | 8/1995  | Lake et al.      | 257/678 |
|-----------|----|---|---------|------------------|---------|
| 5,459,640 | A  | * | 10/1995 | Moutrie et al.   | 361/707 |
| 5,492,842 | A  | * | 2/1996  | Eytcheson et al. | 438/15  |
| 5,519,253 | A  | * | 5/1996  | Lake et al.      | 257/724 |
| 5,539,254 | A  | * | 7/1996  | Eytcheson et al. | 257/691 |
| 5,546,275 | A  | * | 8/1996  | Moutrie et al.   | 361/707 |
| 5,563,447 | A  | * | 10/1996 | Lake et al.      | 257/724 |
| 6,094,350 | A  | * | 7/2000  | Achiriloaie      | 361/737 |
| 6,507,108 | B1 | * | 1/2003  | Lindemann et al. | 257/724 |
| 6,787,900 | B2 | * | 9/2004  | Shinohara et al. | 257/718 |
| 6,921,969 | B2 | * | 7/2005  | Knapp            | 257/704 |
| 6,979,204 | B2 | * | 12/2005 | Gobl et al.      | 439/73  |
| 7,336,717 | B2 | * | 2/2008  | Hammes et al.    | 375/261 |
| 7,495,324 | B2 | * | 2/2009  | Popp et al.      | 257/678 |
| 7,557,442 | B2 | * | 7/2009  | Licht            | 257/720 |
| 7,763,970 | B2 | * | 7/2010  | Tschirbs et al.  | 257/701 |
| 7,808,100 | B2 | * | 10/2010 | Bayerer          | 257/719 |
| 7,880,299 | B2 | * | 2/2011  | Kimura et al.    | 257/718 |

(Continued)

FOREIGN PATENT DOCUMENTS

DE 19942770 A1 3/2001
DE 10142971 A1 3/2003

(Continued)

*Primary Examiner* — Xiaoliang Chen
(74) *Attorney, Agent, or Firm* — Murphy, Bilak & Homiller, PLLC (57) ABSTRACT

The invention relates to a power semiconductor module including a module underside, a module housing, and at least two substrates spaced from each other. Each substrate has a topside facing an interior of the module housing and an underside facing away from the interior of the module housing. The underside of each substrate includes at least one portion simultaneously forming a portion of the module underside. At least one mounting means disposed between two adjacent substrates enables the power semiconductor module to be secured to a heatsink.

24 Claims, 9 Drawing Sheets

(56) References Cited

U.S. PATENT DOCUMENTS

| | | | |
|---|---|---|---|
| 7,906,731 B2* | 3/2011 | Matsui et al. | 174/252 |
| 8,159,822 B2* | 4/2012 | Kanschat et al. | 361/707 |
| 2002/0137369 A1* | 9/2002 | Edwards et al. | 439/77 |
| 2003/0156400 A1* | 8/2003 | Dibene et al. | 361/803 |
| 2004/0089931 A1* | 5/2004 | Nakajima et al. | 257/684 |
| 2004/0164388 A1* | 8/2004 | Stolze | 257/678 |
| 2008/0123297 A1* | 5/2008 | Tilton et al. | 361/700 |
| 2008/0266812 A1* | 10/2008 | Steger et al. | 361/721 |
| 2009/0021916 A1* | 1/2009 | Stolze | 361/709 |
| 2009/0039498 A1* | 2/2009 | Bayerer | 257/700 |
| 2010/0127371 A1* | 5/2010 | Tschirbs | 257/684 |
| 2010/0252922 A1* | 10/2010 | Bayerer et al. | 257/692 |
| 2010/0302741 A1* | 12/2010 | Kanschat et al. | 361/717 |
| 2010/0309660 A1* | 12/2010 | Lim et al. | 362/231 |

FOREIGN PATENT DOCUMENTS

| | | |
|---|---|---|
| DE | 102006005445 A1 | 8/2007 |
| DE | 102007046021 A1 | 5/2008 |
| DE | 10331335 B4 | 10/2008 |
| DE | 102007016222 B3 | 11/2008 |
| JP | 2000-228490 A | 8/2000 |

* cited by examiner

FIG 16

# US 8,514,579 B2

POWER SEMICONDUCTOR MODULE INCLUDING SUBSTRATES SPACED FROM EACH OTHER

PRIORITY CLAIM

This application claims priority to German Patent Application No. 102009002993.1-33 filed on 11 May 2009, the content of which is incorporated herein by reference in its entirety.

FIELD OF TECHNOLOGY

The invention relates to power semiconductor modules.

BACKGROUND

Power semiconductor modules comprise one or more power semiconductor chips. To dissipate the heat materializing in operation of the module the power semiconductor module is usually bonded to a heatsink. This mostly involves employing a complicated system of multiple bonds so that the pressure is evenly distributed.

In addition, the module is often electrically and mechanically bonded to a user-specific gating circuit, this again necessitating a complicated system of multiple bonds for the necessary electrical connections.

The power semiconductor chips of the module are usually mounted on one or more ceramic substrates because of their coefficient of thermal expansion, for one thing, being hardly different to the coefficient of thermal expansion of the semiconductor chips used, and, for another, because they achieve good dissipation of the heat materializing from operation of the power semiconductor chips.

One known possibility of incorporating one or more ceramic substrates componented with power semiconductor chips in a power semiconductor module is to mount all ceramic substrates used on a common solid metal baseplate, the underside of which simultaneously forms the underside of the module and to apply the power semiconductor module by its underside to a heatsink. But, the baseplate hampers good thermal contact between the substrates and the heatsink.

An alternative configuration eliminates the need of a solid metal baseplate. To attain an even distribution of the contact pressure between the substrates and the heatsink the individual substrates are pressed either along their circumferential side edges by the module housing to the heatsink which is bonded to the heatsink by a system of multiple bonds, or each of the substrates features fastener holes so that, for example by means of a screw, a contact pressure can be generated in the interior portion of the substrate in the direction of the heatsink. However, such power semiconductor modules having no common baseplate have either the disadvantage of a complicated system of multiple bonds between the power semiconductor module and the heatsink or mounting holes need to be fabricated in the ceramic substrates, again adding to the complications, taking up valuable space on the substrate, detrimenting dissipating the heat to the heatsink and, to make matters worse, risking a ceramic fracture in the region of each hole.

Furthermore, the more the number of power semiconductor chips incorporated in a power semiconductor module the larger the substrates needed, the greater the footprint thereof, making it all the more difficult to attain a uniform contact pressure of the substrates against the heatsink. In addition to this an expansive substrate componented with a plurality of power semiconductor chips has to be singled out from use or repaired, which is complicated, when even just one of the power semiconductor chips develops a fault.

There is a need for a power semiconductor module comprising no common metal baseplate mounting the substrates of the module and which can be simply mounted on a heatsink with a few bonds whilst in addition permitting bonding to a user-specific gating circuit.

SUMMARY

According to an embodiment, a power semiconductor module comprises a module underside, a module housing and at least two substrates spaced from each other. Each substrate includes a topside facing an interior of the module housing and an underside facing away from the interior of the module housing. The underside of each substrate comprises at least one portion simultaneously forming a portion of the module underside. Via this portion, the waste heat materializing in the power semiconductor module can be dissipated to a heatsink. Furthermore, the module comprises at least one mounting means, e.g., a mounting hole disposed between two adjacent substrates permitting the power semiconductor module to be secured to a heatsink.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

In the Figures—unless stated otherwise—like or corresponding elements having a like or corresponding function are identified by like reference numerals.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top", "bottom", "front", "back" "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
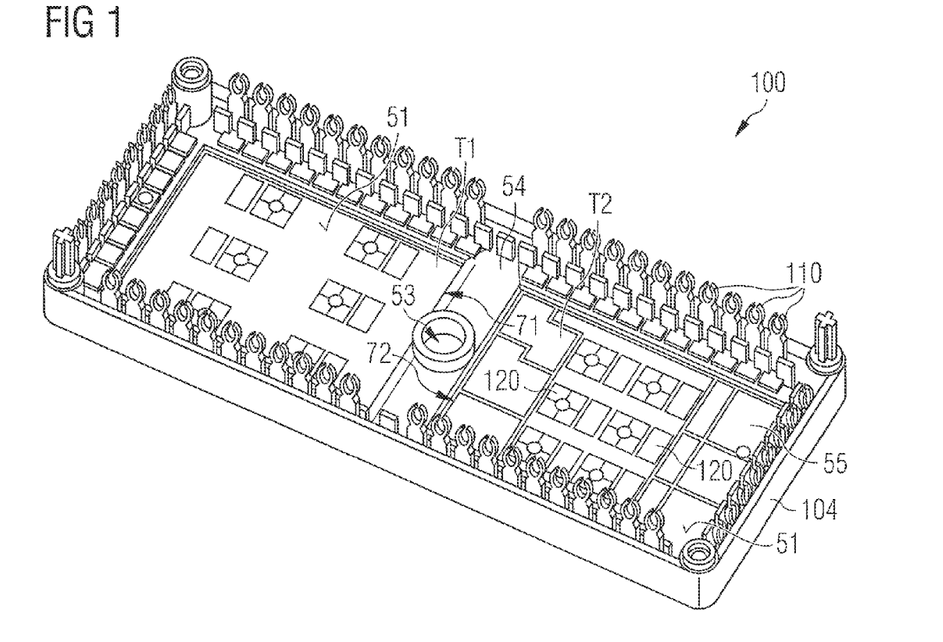
FIG. 1 is a view in perspective of a power semiconductor module including two substrates spaced from each other.

Referring now to FIG. 1 there is illustrated a view in perspective of a power semiconductor module 100 including a module housing 104 as well as two substrates T1 and T2 spaced from each other showing their topsides 51 facing the interior of the module housing. Disposed between the adjacent substrates T1 and T2 is a flange 54 represented as a component of the module housing 104 and wherein a mounting hole 53 is provided by means of which the power semiconductor module 100 can be screwed to a heatsink.

The mounting hole 53 is fully disposed between the two adjacent substrates T1 and T2. In this arrangement, the two adjacent substrates T1 and T2 may comprise two outer edges 71 and 72 facing each other between which the mounting hole 53 is arranged in the middle.

Arranged circuited on the substrates T1 and T2 are power semiconductor chips 120 which may be, for example, IGBTs, backwards conducting IGBTs, MOSFETs, J-FETS, thyristors, diodes or any other kind of a power semiconductor component. More particularly the power semiconductor chips 120 may also be configured as controllable power semiconductor switches.

Each of the substrates T1, T2 features at least on its topside 51 a metallization 55 which may be patterned for circuiting the power semiconductor chips 120. Inserted in the sidewall of the module housing 104 are electrical terminals 110 bonded in the interior module housing 104 to the power semiconductor chips 120 and brought out from the module housing 104 at the topside thereof so that the power semiconductor module 100 can be bonded to a user-specific gating electronics.

To improve the dielectric strength the interior of the module housing 104 may be optionally potted, for example by a silicone gel.

Figure 2:
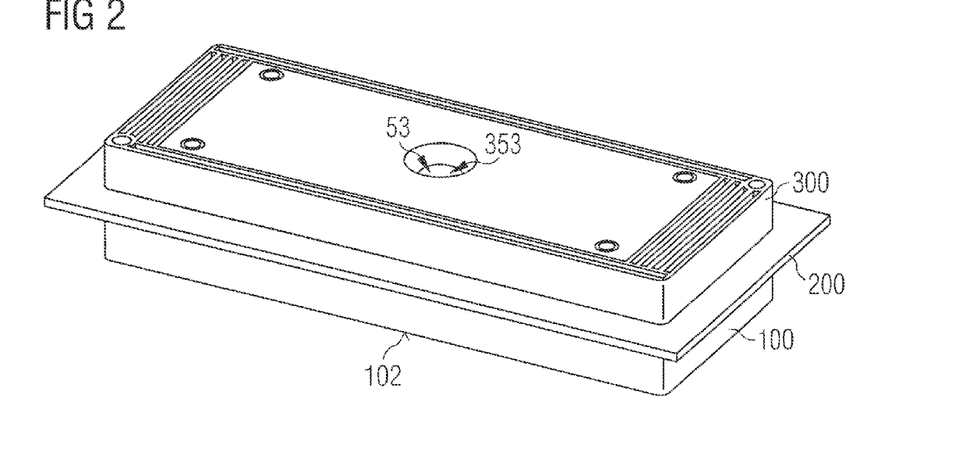
FIG. 2 is a view in perspective of the power semiconductor module as shown in FIG. 1 mounting a printed circuit board including a user-specific gating circuit.

Referring now to FIG. 2 there is illustrated a view in perspective of an assembly including the power semiconductor module 100 as shown in FIG. 1 mounting a printed circuit board 200 including user-specific gating electronics. Provided at the side of the printed circuit board 200 facing away from the power semiconductor module 100 is an optional pressure plate 300 ensuring even distribution of the pressure on the printed circuit board 200 and power semiconductor module 100 when the composite of power semiconductor module 100, printed circuit board 200 and pressure plate 300 is screwed to a heatsink (not shown) for which the pressure plate 300 comprises a mounting hole 353 aligned with the mounting hole 53 of the power semiconductor module 100.

Figure 3:
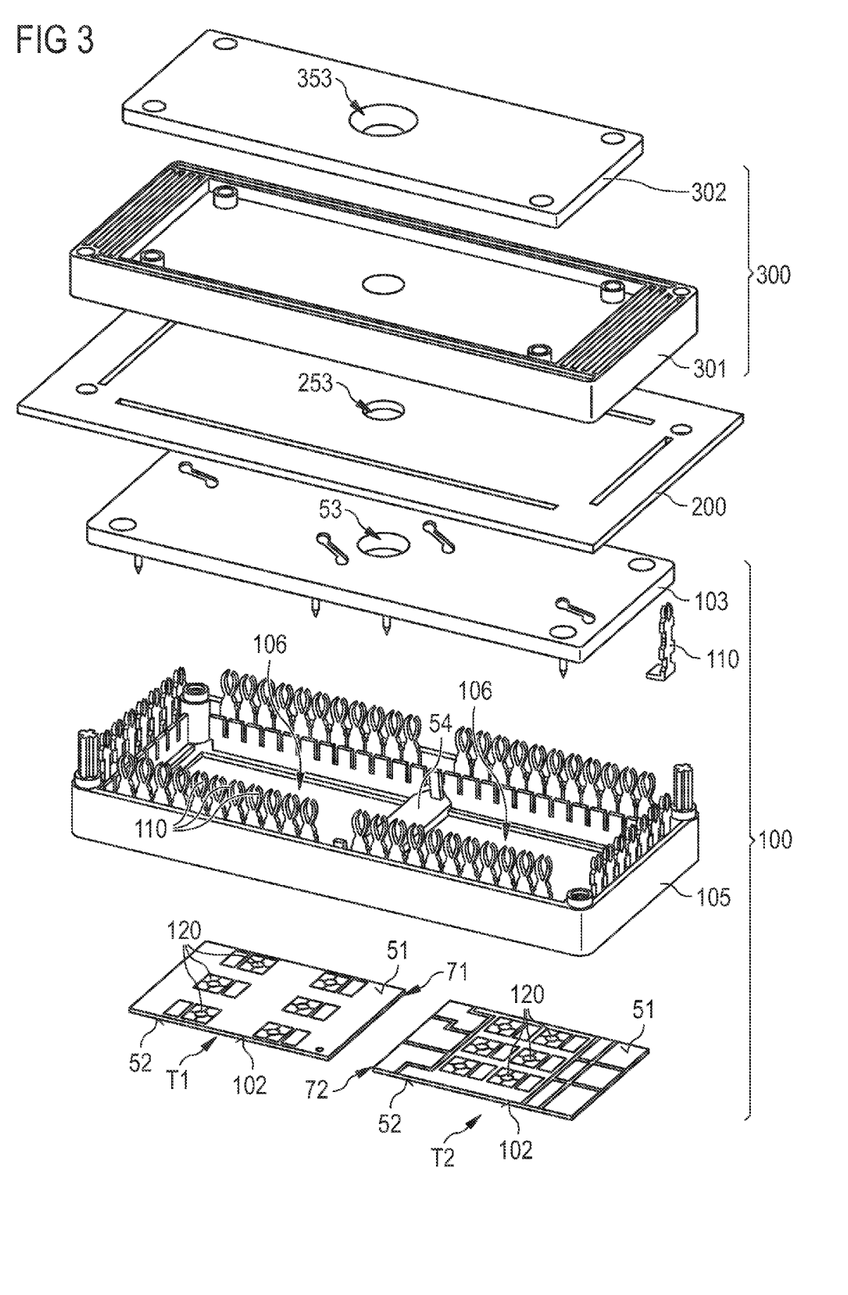
FIG. 3 is an exploded view of the assembly as shown in FIG. 2.

Referring now to FIG. 3 there is illustrated an exploded view of the assembly as shown in FIG. 2, evident being how the module housing 104 of the power semiconductor module 100 comprises a housing frame 105 as well as a flange 54 optionally integrated with the housing frame 105. Formed by the housing frame 105 and flange 54 are two recesses 106 at the underside of the housing frame 105, into each of which one of the substrates T1 and T2 is inserted.

As shown, the module housing 104 may comprise an optional housing cover 103 covering at least the power semiconductor chips 120. One such optional housing cover 103 is configured so that the electrical terminals 110 are accessible from the outer side of the power semiconductor module 100 after the housing cover 103 is located on the housing frame 105. For this purpose, the terminals 110 can be routed to side-step the edge of the housing cover 103 or brought out through holes in the housing cover 103.

The printed circuit board 200 may comprise an electrical gating circuit (not shown in FIG. 3) serving to gate the power semiconductor module 100. The electrical components that may be used for this purpose can be arranged on the underside facing the power semiconductor module 100 and/or topside of the printed circuit board 200 facing away from the power semiconductor module 100. In addition, the printed circuit board 200 comprises a fastener hole 253 configured, for example—relative to the underside 102 of the power semiconductor module 100—as a central fastener hole aligned with the mounting hole 53 of the power semiconductor module 100 and the mounting hole 353 of the pressure plate 300 when correctly mounted.

The printed circuit board 200 and terminals 110 are adapted to each other so that the gating circuit realized on the printed circuit board 200 is properly circuited with the terminals 110 when the printed circuit board 200 is mounted on the power semiconductor module 100.

As is also evident from FIG. 3 the pressure plate 300 may comprise not just one, but several components 301, 302.

Figure 4:
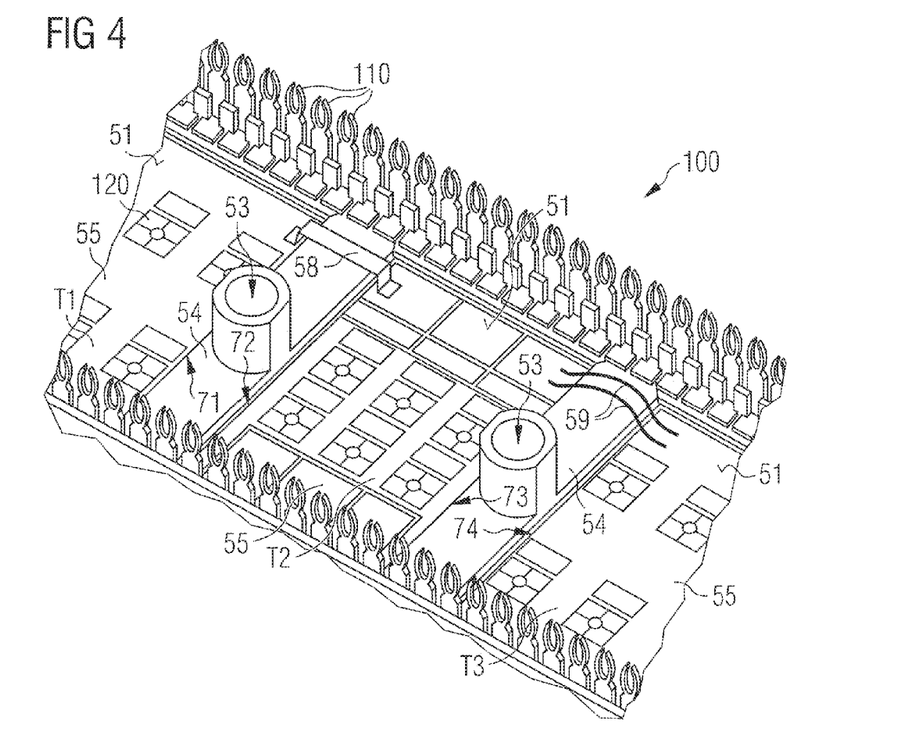
FIG. 4 is a view in perspective of a portion of a power semiconductor module including three substrates spaced from each other, a flange of the module housing being disposed between adjacent substrates.

Referring now to FIG. 4 there is illustrated a portion of a power semiconductor module 100 including three substrates spaced from each other T1, T2, T3 connected in series featuring parallel side edges 71, 72, 73, 74. Disposed between two each adjacent substrates T1/T2 or T2/T3 of the substrates T1, T2, T3 is a flange 54 optionally integrated including a housing frame (not shown). These flanges 54—like the housing frame—may be engineered in plastics, for example. In an alternative aspect the underside of the housing frame may also be formed by a printed circuit board incorporating the recesses 106 (see FIG. 3). In this configuration, the flange 54 may also be configured as a portion of one such printed circuit board.

Each flange 54 features a mounting hole 53 by means of which the power semiconductor module 100 can be screwed to a heatsink. Topping each mounting hole 53 and arranged on each corresponding flange 54 is a cylindrical ring which may be configured integral with the corresponding flange 54 in serving to prevent weeping of a potting compound through the corresponding mounting hole 53 when the module 100 is potted.

To electrically conductively connect the circuits realized on the substrates T1, T2 and T3 as needed, electrical bonds may be provided so that adjacent substrates T1/T2 or T2/T3 are electrically bonded over the interposed flange 54. One such bonding element may be configured, for example, as a metallic clip 58 soldered or welded to the topside metallization 55 of the corresponding substrates T1 and T2 or as a bond wire 59 bonded at the topside metallization 55 of the adjacent substrates T2 and T3 to be electrically conductively connected.

Figure 5:
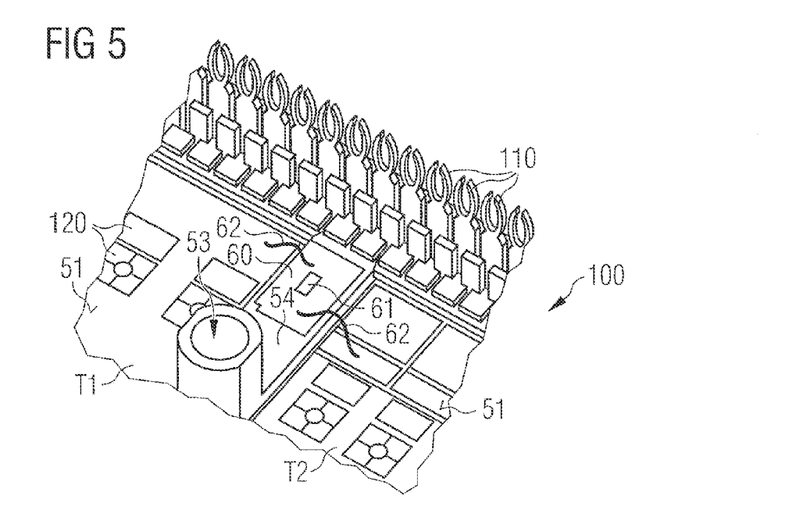
FIG. 5 is a view in perspective of a power semiconductor module including two substrates spaced from each other between which a flange is disposed to which a printed circuit board is secured.

Referring now to FIG. 5 there is illustrated a view in perspective of a portion of a power semiconductor module 100 including two substrates spaced from each other T1 and T2 between which a flange 54 is disposed as described above mounting an optional printed circuit board 60 which in one embodiment may serve as a support module for bonding adjacent substrates T1 and T2 componented where required with electrical components 61 interconnected via the printed circuit board 60. The printed circuit board 60 may be electrically bonded, for example, —as shown—by means of bond wires 62 to the substrates T1 and T2 bordering the flange 54.

As an alternative or in addition thereto it is possible that the printed circuit board 60 is electrically bonded to one or more of the terminals 110 in bonding the printed circuit board 60 by means of bond wires or other electrical bonding means to one or more of the terminals 110.

Figure 6:
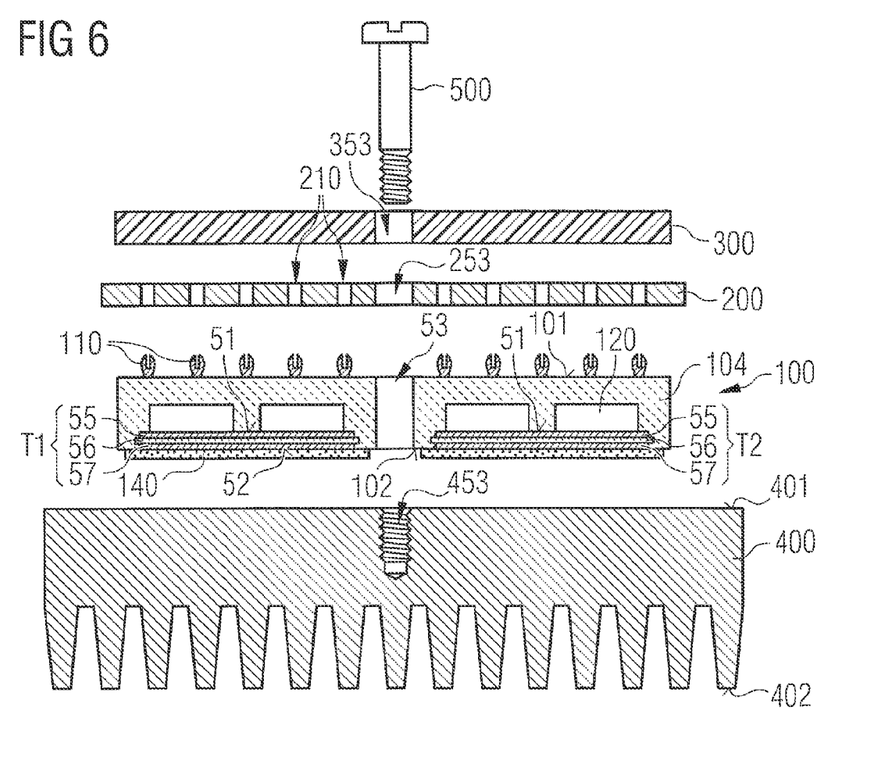
FIG. 6 is a vertical section through an assembly as shown in FIGS. 2 and 3 wherein the power semiconductor module comprises a plurality of electrical contacts brought out from the topside of the module housing and configured as press-in contacts.

Referring now to FIG. 6 there is illustrated a vertical section through an assembly basically the same as shown in FIGS. 2 and 3 comprising in sequence a heatsink 400, a power semiconductor module 100, a printed circuit board 200 and a pressure plate 300. These components are aligned so that a mounting hole 353 of the pressure plate 300 is in line with fastener hole 253 of the printed circuit board 200 and mounting hole 53 of the power semiconductor module 100 as well as including a tapped hole 453 of the heatsink 400 so that the individual components can be joined together in the sequence as shown by means of a fastener 500 configured, for example, as a screw. To optimize the thermal contact between the underside 102 of the power semiconductor module 100 and the topside 401 of the heatsink 400 a thermal transfer medium 140, for example a thermal compound, may be applied to the underside 102 of the power semiconductor module 100 and/or topside 401 of the heatsink 400.

The terminals 110 used in the power semiconductor module 100 as shown are, for example, press-in contacts, the ends of which protruding from the module housing 104 are pressed into corresponding holes 210 of the printed circuit board 200 to electrically bond the printed circuit board 200 and via the patterning of the tracks to the gating circuit. Not shown in FIG. 6 is how the printed circuit board 200 is componented.

The substrates T1 and T2 each comprise at their topsides 51 a metallization 55 which may be patterned, as well as at their undersides 52 an optional underside metallization 57. Each of the substrates T1 and T2 features the metallization 55 as well as the optionally underside metallization 57 applied to an insulator 56, for example, a ceramic platelet made, for example, of aluminum oxide, silicon nitride or aluminum nitride ceramic whilst the substrates T1 and T2 may be configured as direct copper bonding (DCB), direct aluminum bonding (DAB) or active metal brazing (AMB) substrates.

Figure 7:
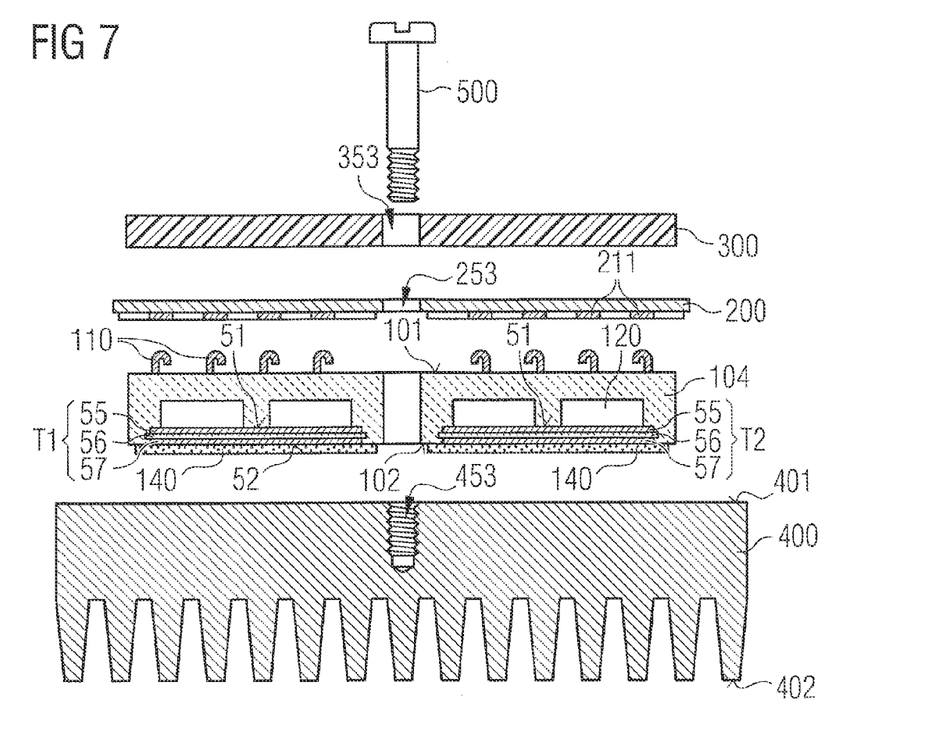
FIG. 7 is a vertical section through an assembly as shown in FIGS. 2 and 3 wherein the power semiconductor module comprises a plurality of electrical contacts brought out from the topside of the module housing and configured as pressure contacts.

Referring now to FIG. 7 there is illustrated how the assembly as shown therein differs from the assembly as shown in FIG. 6 in that the power semiconductor module 100 comprises terminals 110 configured as spring contacts for pressure-contacting the power semiconductor module 100 to the corresponding contact pad 211 of the printed circuit board 200.

Figure 8:
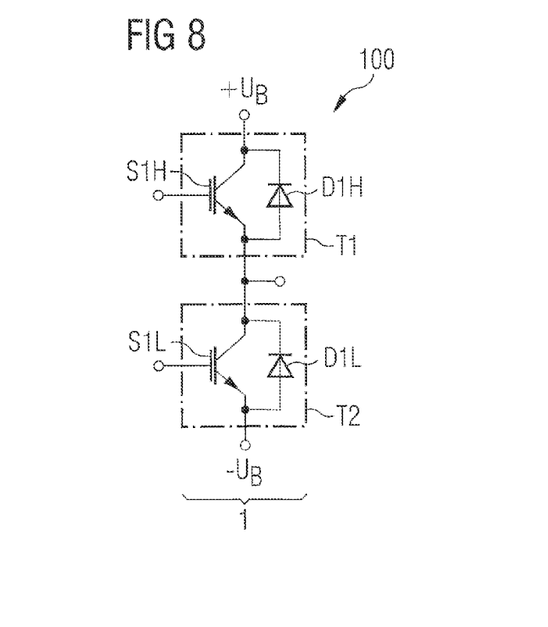
FIG. 8 is a circuit diagram of a power semiconductor module including two discrete power semiconductor switches arranged on separate substrates.

Referring now to FIG. 8 there is illustrated a circuit diagram of a power semiconductor module 100 featuring two controllable power semiconductor switches S1H and S1L whose load circuits are connected in series to a half-bridge 1 comprising for feeding a positive power supply voltage +UB and a negative power supply voltage −UB a top terminal and bottom terminal respectively.

In keeping with the present application as regards two controllable power semiconductor switches S1H and S1L intercircuited into a half-bridge, the controllable power semiconductor switch S1H nearest to the contact for the supply of the positive power supply voltage +U$_B$ is termed a high-side switch and the controllable power semiconductor switch S1L nearest to the contact for the supply of the negative power supply voltage −U$_B$ is termed a low-side switch.

Optionally a free-wheeling diode D1H and D1L can be connected in antiparallel to each controllable power semiconductor switch S1H and S1L respectively. The designation of the controllable power semiconductor switches and free-wheeling diodes as used in the present application is in accordance with the following systematics:

The first term "S" designates a controllable power semiconductor switch, and "D" a diode. The number following as the second term (in the present example the "1") corresponds to the number of the half-bridge. An "H" as the third term means that the component involved is a "high-side component", i.e., a component arranged at the side of the half-bridge contact provided to supply the positive power supply voltage +U$_B$ whilst an "L" as the third term means a low-side component, i.e., arranged at the side of the contact provided to supply the negative power supply voltage −U$_B$.

A controllable power semiconductor switch S1H, S1L in the sense of the present application is understood as a logic unit realized either by means of exactly just one power semiconductor chip or, however, by means of two or more power semiconductor chips connected in parallel. One such power switch realized by means of exactly just one power semiconductor chip is termed a single switch in the following.

Referring again to FIG. 8 there is illustrated an assembly in which each of the controllable power semiconductor switches S1H and S1L is arranged on its own substrate T1 and T2 respectively located spaced from each other in the power semiconductor module 100. In FIG. 8, the same as in the subsequent Figures, the various substrates spaced from each other T1, T2 and where necessary T3 of a power semiconductor module are depicted by broken lines, i.e., all components S1H, D1H or S1L, D1L depicted boxed by a broken line are sited on the substrates T1 and T2 respectively corresponding to the broken line. This does not apply, however, to the conductor tracks and circuit nodes likewise represented.

Figure 9:
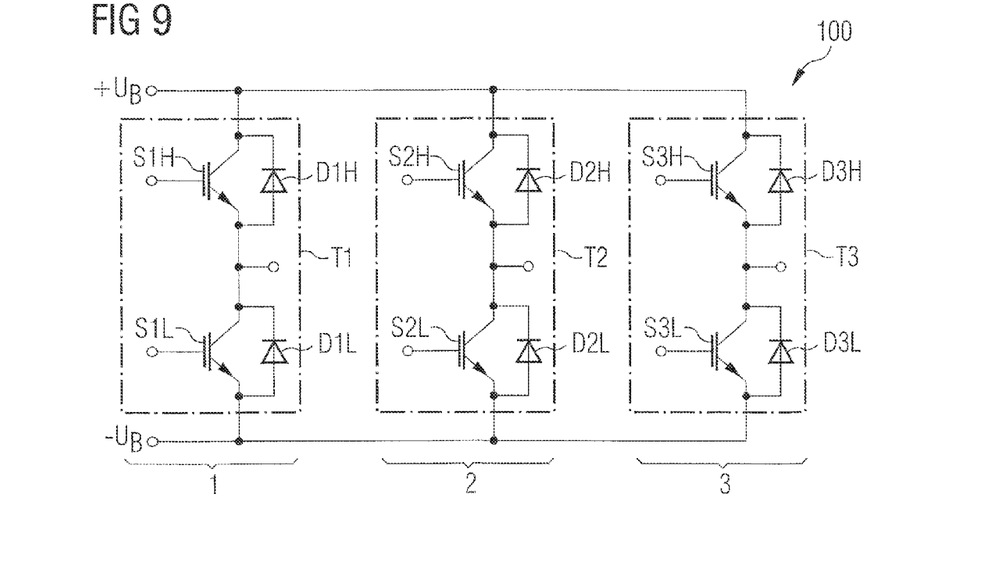
FIG. 9 is a circuit diagram of a power semiconductor module including three half-bridges, each of which is arranged on a separate substrate.

Referring now to FIG. 9 there is illustrated a circuit diagram of another power semiconductor module 100 comprising three substrates spaced from each other T1, T2 and T3 on each of which a half-bridge 1, 2 and 3 respectively is arranged. Each of these half-bridges 1, 2 and 3 comprises a controllable high-side power semiconductor switch S1H, S2H and S3H and a controllable low-side power semiconductor switch S1L, S2L and S3L respectively. In each of the half-bridges 1, 2 and 3 the load circuit of the corresponding controllable high-side power semiconductor switch is connected in series to the load circuit of the corresponding controllable low-side power semiconductor switch. Optionally a free-wheeling diode D1H, D2H, D3H, D1L, D2L and D3L respectively can be circuited antiparallel to the load circuit of each controllable power semiconductor switch S1H, S2H, S3H, S1L, S2L and S3L respectively. Each of these free-wheeling diodes is arranged on the same substrate T1, T2 and T3 as the corresponding controllable power semiconductor switch whose load circuit features the corresponding free-wheeling diode circuited in antiparallel.

The half-bridges 1, 2, 3 can be optionally connected in parallel to permit a common supply of a positive power supply voltage +U$_B$ and a negative power supply voltage −U$_B$.

Figure 10:
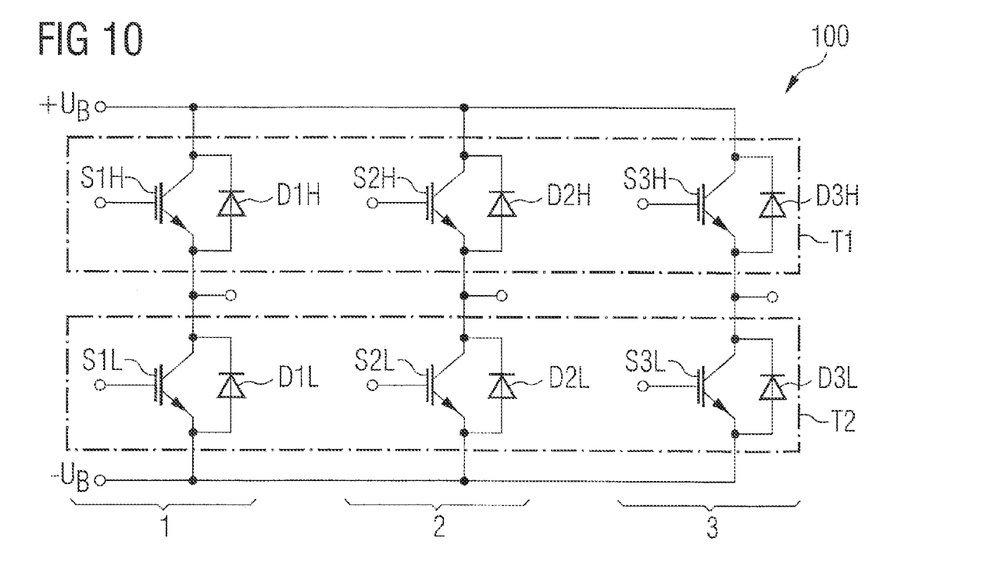
FIG. 10 is a circuit diagram of a power semiconductor module including three half-bridges, each of which comprises a high-side switch and a low-side switch, wherein the high-side switches are arranged in common on a first substrate and the low-side switches on a second substrate.

Referring now to FIG. 10 there is illustrated a circuit diagram of a power semiconductor module 100 comprising three half-bridges 1, 2, 3 which may be circuited just the same as the three half-bridges 1, 2, 3 as shown in FIG. 9. The power semiconductor module 100 as shown in FIG. 10 differs from that as shown in FIG. 9 by a different assembly of the controllable power semiconductor switches and the corresponding optional free-wheeling diodes. In the power semiconductor module 100 as shown in FIG. 10 the controllable high-side power semiconductor switches S1H, S2H, S3H of all half-bridges 1, 2, 3 are arranged on a substrate T1 and all controllable low-side power semiconductor switches S1L, S2L and S3L of the half-bridges 1, 2, 3 on another substrate T2 separate from the substrate T1.

Optionally a free-wheeling diode D1H, D2H, D3H, D1L, D2L and D3L respectively may be circuited in antiparallel to the load circuit of each controllable power semiconductor switches S1H, S2H, S3H, S1L, S2L and S3L and arranged on the same substrates T1 and T2 respectively the same as the controllable power semiconductor switches S1H, S2H, S3H, S1L, S2L and S3L belonging to the corresponding free-wheeling diode D1H, D2H, D3H, D1L, D2L and D3L.

Figure 11:
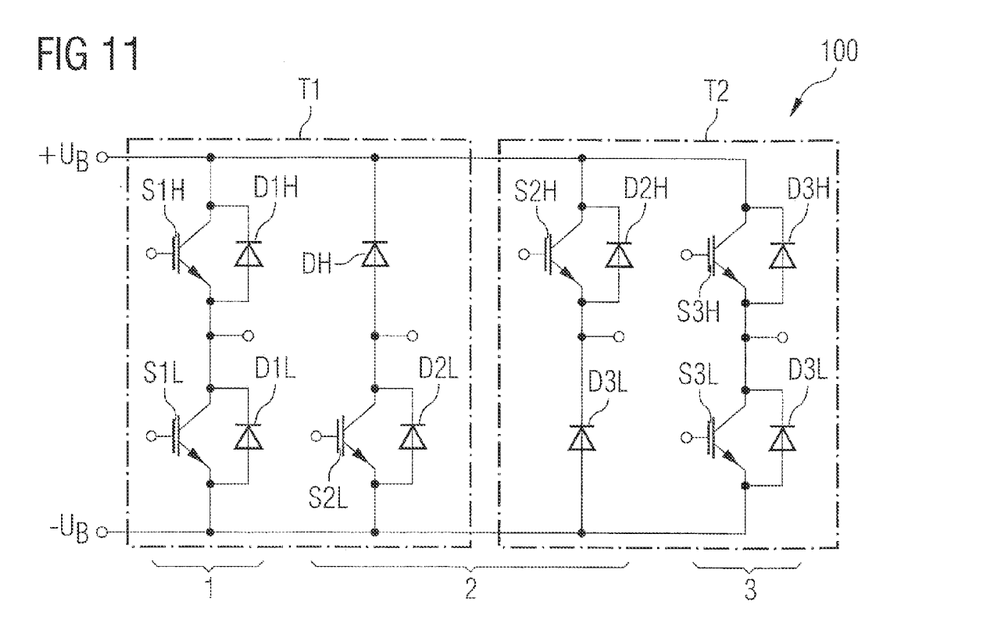
FIG. 11 is a circuit diagram of a power semiconductor module including three half-bridges, of which a first is arranged on a first substrate and a second on a second substrate wherein the third half-bridge comprises a high-side power semiconductor switch arranged on the first substrate as well as a low-side power semiconductor switch arranged on the second substrate.

Referring now to FIG. 11 there is illustrated a circuit diagram of a power semiconductor module 100 including a half-bridge 2 the controllable low-side power semiconductor switch S2L of which is arranged on a first substrate T1 and the controllable high-side power semiconductor switch S2H of which is arranged on a second substrate T2 spaced from the first substrate T1.

Furthermore, the second half-bridge 2 comprises an optional high-side diode DH connected in series to the load circuit of the controllable low-side power semiconductor switch S2L and which is arranged on the first substrate T1. Correspondingly the half-bridge 2 comprises a low-side diode DL connected in series to the load circuit of the controllable high-side power semiconductor switch S2H and which is arranged on the second substrate T2. The high-side diode DH is arranged on the first substrate T1 and the low-side diode DL on the second substrate T2.

Furthermore, arranged on the first substrate T1 is an optional further half-bridge 1 including controllable power semiconductor switches S1H and S1L as well as free-wheeling diodes D1H and D1L and correspondingly an optional half-bridge 3 including controllable power semiconductor switches S3H and S3L as well as free-wheeling diodes D3H and D3L is arranged on the second substrate T2.

Figure 12:
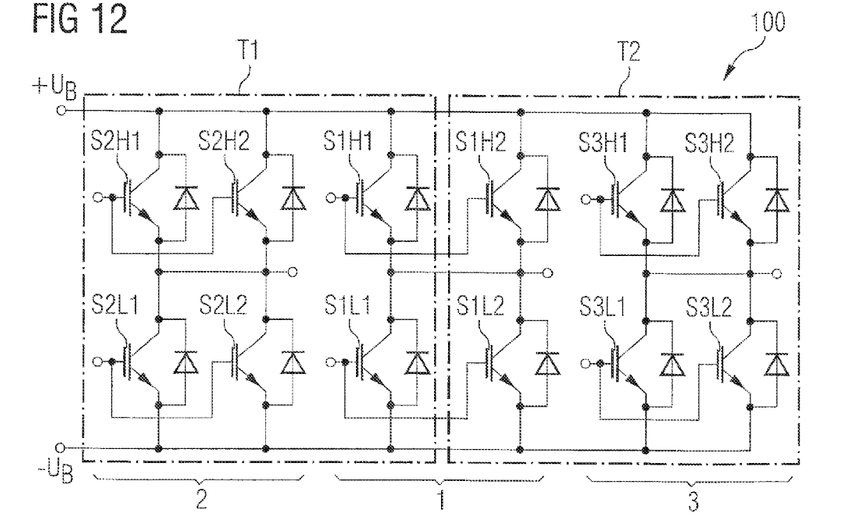
FIG. 12 is a circuit diagram of a power semiconductor module including three half-bridges, at least one of which comprises a controllable low-side power semiconductor switch and a controllable high-side power semiconductor switch, wherein both the low-side and the high-side power semiconductor switches each comprise a first single switch as well as a second single switch arranged on the second substrate.

Referring now to FIG. 12 there is illustrated a circuit diagram of a power semiconductor module 100 including a half-bridge 1 the controllable power semiconductor switch S1H of which comprises two controllable single power semiconductor switches S1H1 and S1H2 connected in parallel and the controllable low-side power semiconductor switch S1L of which comprises two controllable single power semiconductor switches S1L1 and S1L2 connected in parallel. The controllable single power semiconductor switches S1H1 and S1L1 are realized as power semiconductor chips and arranged on a first substrate T1. Correspondingly, the controllable single switches S1H2 and S1L2 are also realized as power semiconductor chips but arranged on a second substrate T2 spaced from the second substrate T1.

As shown, every controllable high-side power semiconductor switch S2H, S3H of the second half-bridge 2 and third half-bridge 3 and every controllable low-side power semiconductor switch S2L, S3L of the second half-bridge 2 and third half-bridge 3 can be formed by a parallel circuit of two or more controllable power semiconductor switches S2H1 in parallel with S2H2, S3H1 in parallel with S3H2, S2L1 in parallel with S2L2 or S3L1 in parallel with S2L2.

Figure 13:
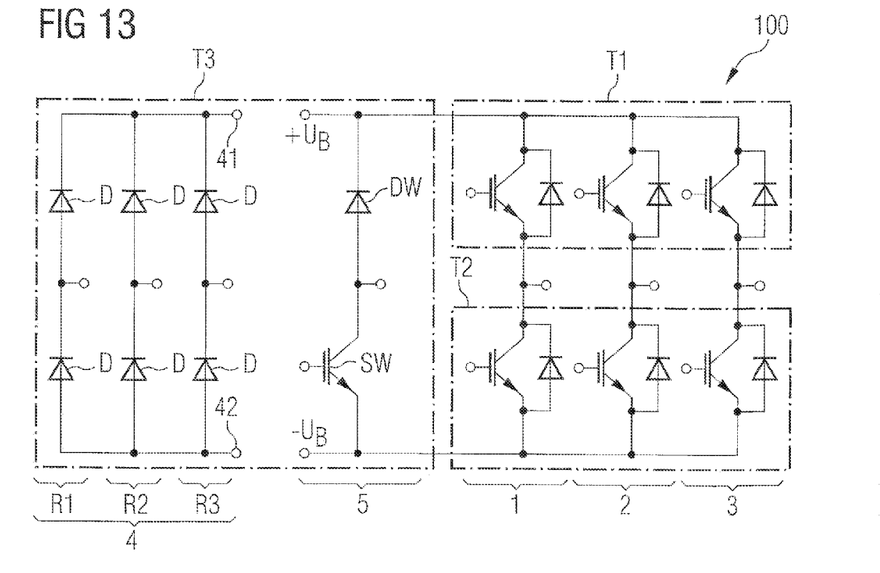
FIG. 13 is a circuit diagram of a power semiconductor module comprising two componented substrates as shown in FIG. 10, as well as a further substrate on which a bridge rectifier switch as well as a brake chopper circuit are arranged.

Referring now to FIG. 13 there is illustrated a circuit diagram of a power semiconductor module 100 comprising three half-bridges 1, 2, 3 intercircuited the same as described with reference to FIG. 10 and which may be arranged separate on two substrates T1 and T2, in addition to which a third substrate T3 is provided spaced from the substrates T1 and T2. Arranged on the third substrate T3 is a bridge rectifier circuit 4 realized, for example, by means of diodes D. The bridge rectifier circuit 4 serves to rectify an at least two-phase alternating current. The bridge rectifier circuit 4 comprises for each phase a series circuit of R1, R2 and R3 each including a series circuit of two diodes D. These series circuits R1, R2 and R3 are connected in parallel to thus provide an intermediate circuit voltage between two outputs 41 and 42 of the bridge rectifier circuit 4.

Arranged on the third substrate T3 is in addition a brake chopper circuit 5 comprising a controllable power semiconductor switch SW featuring connected in series to its load circuit a diode DW.

Figure 14:
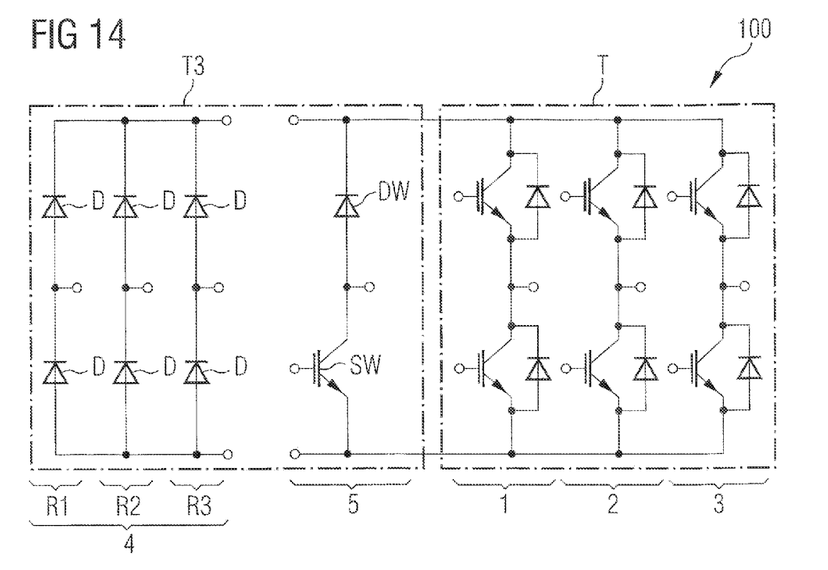
FIG. 14 is a circuit diagram of a power semiconductor module including a first substrate on which three half-bridge branches are arranged, as well as a second substrate on which a bridge rectifier circuit and a brake chopper circuit are arranged.

Referring now to FIG. 14 there is illustrated a circuit diagram of a power semiconductor module 100 different from that as shown in FIG. 13 in that the half-bridges 1, 2, 3 are now arranged on a common substrate T.

Figure 15:
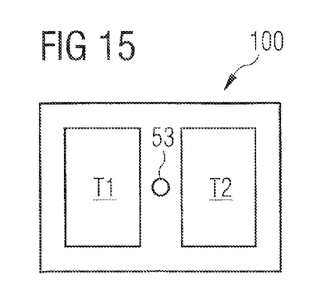
FIG. 15 is a top-down view of two power semiconductor module substrates including a single mounting hole.
Figure 16:
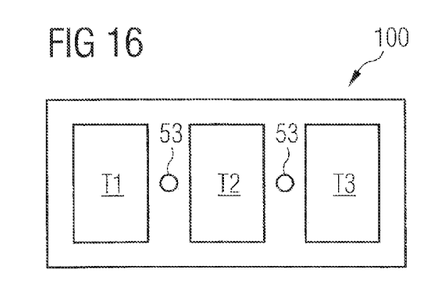
FIG. 16 is a top-down view of three power semiconductor module substrates including two mounting holes.

Referring now to FIGS. 15 and 16 it will now be explained how one or more mounting holes 53 of a power semiconductor module 100 may be arranged in relation to two or more substrates T1, T2 and T3 respectively of the module 100 with reference to examples shown diagrammatically.

The assembly as shown in FIG. 15 shows two substrates spaced from each other T1 and T2. The module 100 comprises a single mounting hole 53 arranged in the middle between the substrates T1 and T2.

Correspondingly, the assembly as shown in FIG. 16 shows three substrates spaced from each other T1, T2 and T3, the power semiconductor module 100 here comprising two mounting holes 53 each arranged in the middle between a pair of adjacent substrates T1 and T2 respectively T2 and T3.

It is understood that in any power semiconductor module 100 having a number N1 of substrates T1, T2, T3 and a number N2 of mounting hole 53 the ratio N2:N1 may be generally selected, for example, smaller than 1 or smaller than ⅔.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims. Unless the features of the appended claims do not exclude each other, these features may be combined in an arbitrary manner.

What is claimed is:

1. A power semiconductor module comprising:
   a module underside;
   a module housing;
   at least two substrates spaced from each other, each substrate comprising a topside facing an interior of the module housing and an underside facing away from the interior of the module housing, and each substrate comprising a topside metallization at its topside;
   wherein
   the underside of each substrate comprises at least one portion simultaneously forming a portion of the module underside; and
   at least one mounting means disposed between two adjacent substrates enables the power semiconductor module to be secured to a heatsink.

2. The power semiconductor module as set forth in claim 1, wherein the mounting means is configured as a mounting hole extending in a direction perpendicular to the module underside through the power semiconductor module.

3. The power semiconductor module as set forth in claim 1, wherein the mounting means is arranged fully between the two adjacent substrates.

4. The power semiconductor module as set forth in claim 1, wherein the mounting means is arranged in the middle between two outer edges facing each other of the two adjacent substrates.

5. The power semiconductor module as set forth in claim 1, wherein the topside metallizations of at least two substrates are electrically conductively connected by means of a bonding element.

6. The power semiconductor module as set forth in claim 5, wherein the bonding element is configured as a bond wire or as a clip.

7. The power semiconductor module as set forth in claim 1, wherein each substrate comprises at its underside an underside metallization.

8. The power semiconductor module as set forth in claim 1, wherein at least one, several or every substrate is configured as a metallized ceramic platelet.

9. The power semiconductor module as set forth in claim 1, wherein none of the substrates comprises a through-hole between the topside and underside.

10. The power semiconductor module as set forth in claim 1, wherein the module housing comprises at the underside recesses into which the substrates are inserted.

11. The power semiconductor module as set forth in claim 1, wherein at least two adjacent substrates are spaced from each other by means of a flange disposed in-between the at least two adjacent substrates.

12. The power semiconductor module as set forth in claim 1, comprising a number of terminals bonded electrically in the interior of the module housing to at least one substrate and brought out from the topside of the module housing.

13. The power semiconductor module as set forth in claim 1, wherein arranged on each substrate is at least one power semiconductor chip.

14. The power semiconductor module as set forth in claim 13, wherein on each substrate at least one of the following components is arranged: an IGBT, a backwards conducting IGBT, a MOSFET, a J-FET, a thyristor, and a diode.

15. The power semiconductor module as set forth in claim 13, wherein arranged on each substrate are at least one controllable power semiconductor switch and a free-wheeling diode.

16. The power semiconductor module as set forth in claim 13, comprising at least two half-bridge branches each comprising a controllable high-side power semiconductor switch and a controllable low-side power semiconductor switch having load circuits connected in series, each half-bridge branch being arranged on another of the substrates.

17. The power semiconductor module as set forth in claim 13, comprising at least two half-bridge branches each comprising a controllable high-side power semiconductor switch and a controllable low-side power semiconductor switch having load circuits connected in series, all of the controllable high-side power semiconductor switches being arranged on a first one of the substrates and all of the controllable low-side power semiconductor switches being arranged on a second one of the substrates.

18. The power semiconductor module as set forth in claim 13, comprising a first half-bridge branch, a second half-bridge branch and a third half-bridge branch, each of which comprises a controllable high-side power semiconductor switch and a controllable low-side power semiconductor switch having load circuits connected in series, wherein
   the controllable high-side power semiconductor switch of the first half-bridge branch and the controllable low-side power semiconductor switch of the first half-bridge branch and of the second half-bridge branch together with a high-side diode connected in series including a load circuit of the controllable low-side power semiconductor switch of the second half-bridge branch are arranged on a first one of the substrates; and
   the controllable low-side power semiconductor switch of the third half-bridge branch and the controllable high-side power semiconductor switch of the second half-bridge branch and of the third half-bridge branch together with a low-side diode connected in series including a load circuit of the controllable high-side power semiconductor switch of the second half-bridge branch are arranged on a second one of the substrates.

19. The power semiconductor module as set forth in claim 18, comprising, for each controllable high-side power semiconductor switch and for each controllable low-side power semiconductor switch of the at least one power semiconductor chip, a free-wheeling diode arranged together with the corresponding controllable high-side or low-side power semiconductor switch on the same substrate and circuited antiparallel to the load circuit of the corresponding controllable high-side or low-side power semiconductor switch.

20. The power semiconductor module as set forth in claim 13, comprising a first half-bridge branch comprising a controllable high-side power semiconductor switch and a controllable low-side power semiconductor switch, wherein:

the controllable high-side power semiconductor switch of the first half-bridge branch comprises at least two controllable high-side single power semiconductor switches having load circuits connected in parallel;

the controllable low-side power semiconductor switch of the first half-bridge branch comprises at least two controllable low-side single power semiconductor switches having load circuits connected in parallel;

at least one of the controllable high-side single power semiconductor switches is arranged on a first one of the substrates;

at least one of the controllable high-side single power semiconductor switches is arranged on a second one of the substrates;

at least one of the controllable low-side single power semiconductor switches is arranged on the first one of the substrates;

at least one of the controllable low-side single power semiconductor switches is arranged on the second one of the substrates.

21. The power semiconductor module as set forth in claim 20, comprising a second half-bridge branch and a third half-bridge branch each comprising a controllable high-side power semiconductor switch and a controllable low-side power semiconductor switch having load circuits connected in series, wherein:

the controllable high-side power semiconductor switch and the controllable low-side power semiconductor switch of the second half-bridge branch are arranged on the first one of the substrates; and the controllable high-side power semiconductor switch and the controllable low-side power semiconductor switch of the third half-bridge branch are arranged on the second one of the substrates.

22. The power semiconductor module as set forth in claim 21, comprising for each controllable high-side single power semiconductor switch and for each controllable low-side single power semiconductor switch a free-wheeling diode each of which is circuited antiparallel to the load circuit of the corresponding controllable high-side or low-side single power semiconductor switch.

23. The power semiconductor module as set forth in claim 17, comprising:

a bridge rectifier circuit for rectifying a multiphase alternating current including a number of $N \geqq 2$ phases, the bridge rectifier circuit comprising for each of the N phases two rectifier diodes circuited to form a series circuit, the resulting N series circuits being connected in parallel;

a further diode as well as a further controllable power semiconductor switch the load circuit of which is connected in series to the further diode;

wherein the rectifier diodes of the bridge rectifier circuit, the further diode and the further controllable power semiconductor switch are arranged on a third one of the substrates.

24. The power semiconductor module as set forth in claim 13, comprising:

at least three half-bridge branches each comprising a controllable high-side power semiconductor switch and a controllable low-side power semiconductor switch having load circuits connected in series, each half-bridge branch being arranged on a first one of the substrates;

a bridge rectifier circuit for rectifying a multiphase alternating current including a number of $N \geqq 2$ phases, the bridge rectifier circuit comprising for each of the N phases two rectifier diodes circuited to form a series circuit, the resulting N series circuits being connected in parallel;

a further diode as well as a further controllable power semiconductor switch the load circuit of which is connected in series to the further diode;

wherein the rectifier diodes of the bridge rectifier circuit, the further diode and the further power semiconductor switch are arranged on a second one of the substrates.

* * * * *